United States Patent [19]

Warkentin et al.

[11] Patent Number: 4,879,605
[45] Date of Patent: Nov. 7, 1989

[54] RASTERIZATION SYSTEM UTILIZING AN OVERLAY OF BIT-MAPPED LOW ADDRESS RESOLUTION DATABASES

[75] Inventors: Paul A. Warkentin, Aloha; Michael L. Rieger; Chris A. Michalski, both of Portland; Matthew J. Jolley, Hillsboro, all of Oreg.

[73] Assignee: ATEQ Corporation, Beaverton, Oreg.

[21] Appl. No.: 161,986

[22] Filed: Feb. 29, 1988

[51] Int. Cl.$^4$ .......... H04N 1/21; H04N 1/22; G01D 9/42; G06F 15/40
[52] U.S. Cl. .................. 358/296; 364/519; 346/108
[58] Field of Search .......... 400/121, 124, 125, 54; 358/285, 296; 364/519; 346/108

[56] References Cited

U.S. PATENT DOCUMENTS

| | | | |
|---|---|---|---|
| 4,159,882 | 7/1979 | Sanders | 400/124 |
| 4,384,338 | 5/1983 | Bennett | 358/104 |
| 4,555,191 | 11/1985 | Gojo | 400/121 |
| 4,749,989 | 6/1988 | Carosso | 364/519 |

FOREIGN PATENT DOCUMENTS 2183121 11/1986 United Kingdom .

*Primary Examiner*—H. Broome
*Assistant Examiner*—Scott A. Rogers
*Attorney, Agent, or Firm*—Blakely, Sokoloff, Taylor & Zafman

[57] ABSTRACT

A method and apparatus for providing improved address resolution in a rasterization system. The rasterization system of the present invention comprises a pattern database, a pattern delivery computer, a rasterizer and a radiant energy system in which a plurality of logical passes are made across a substrate to produce photolithographically formed patterns. The plurality of passes use a combination of offset printing techniques and application of energy to photosensitive material at a plurality of intensities to provide improved address resolution.

23 Claims, 11 Drawing Sheets

FIG_1A (PRIOR ART)
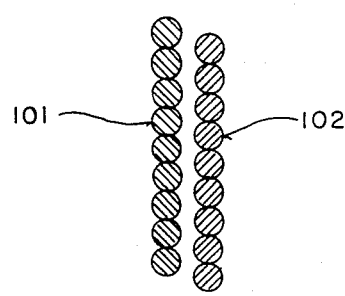
FIG_1B (PRIOR ART)
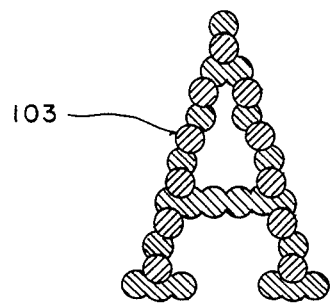
FIG_1C (PRIOR ART)
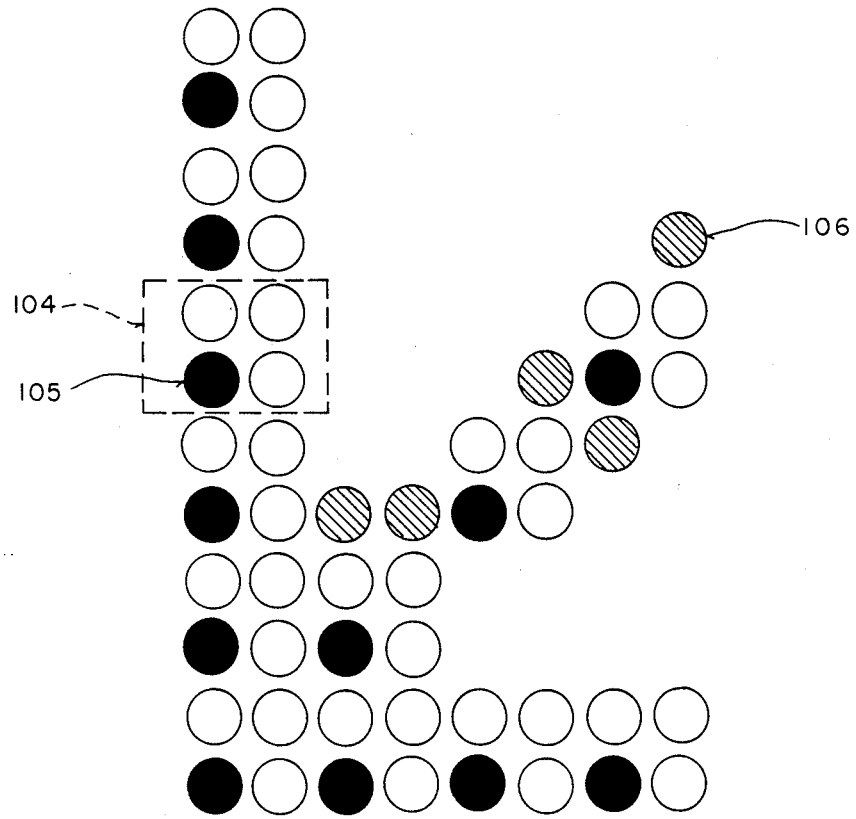

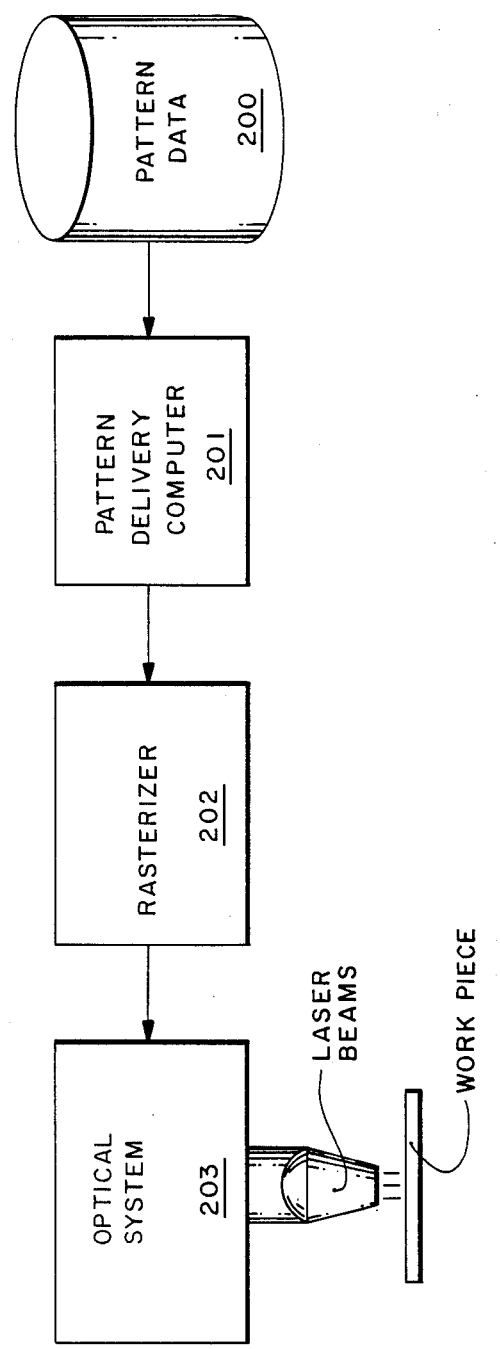
FIG_2 (PRIOR ART)

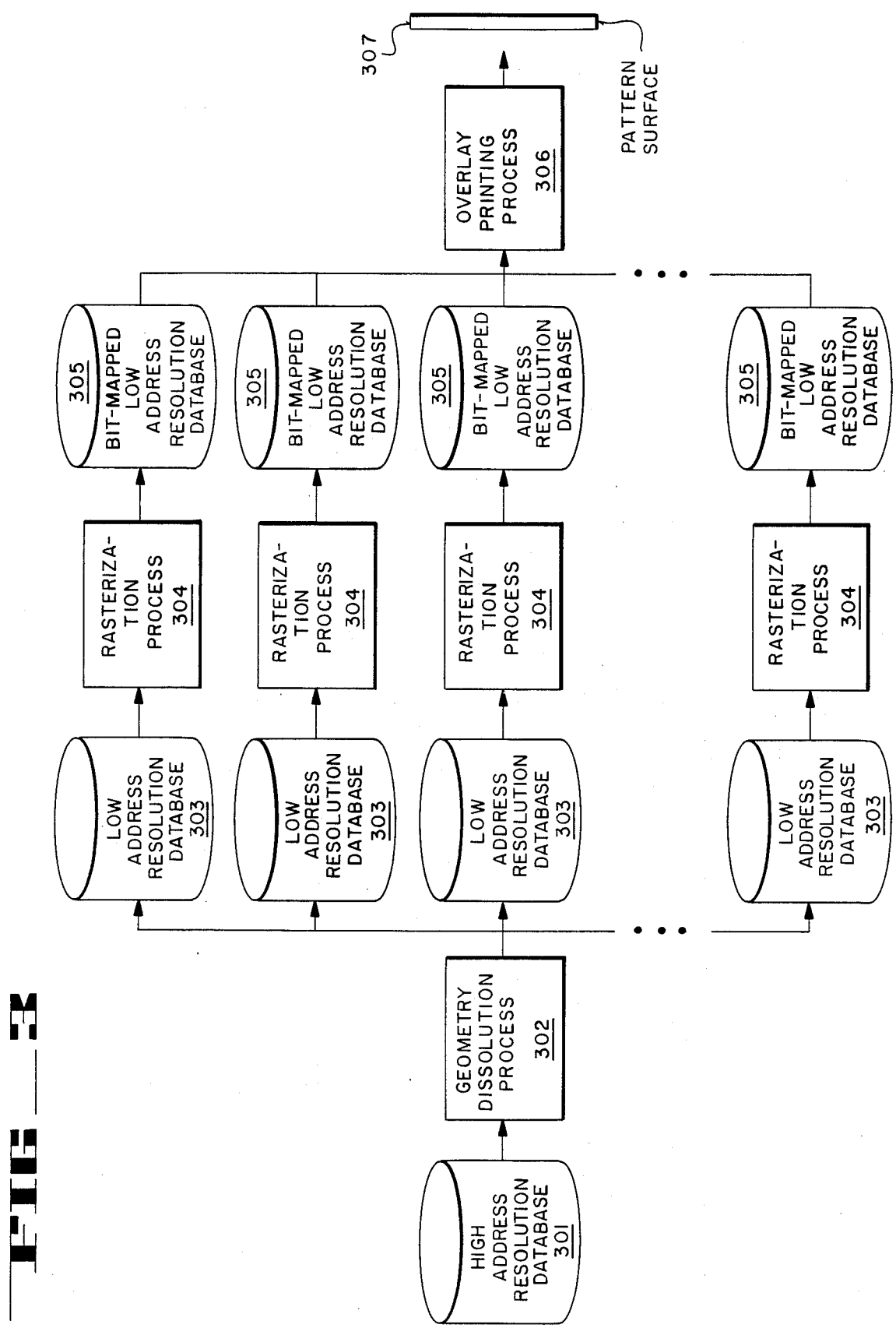

FIG_4A
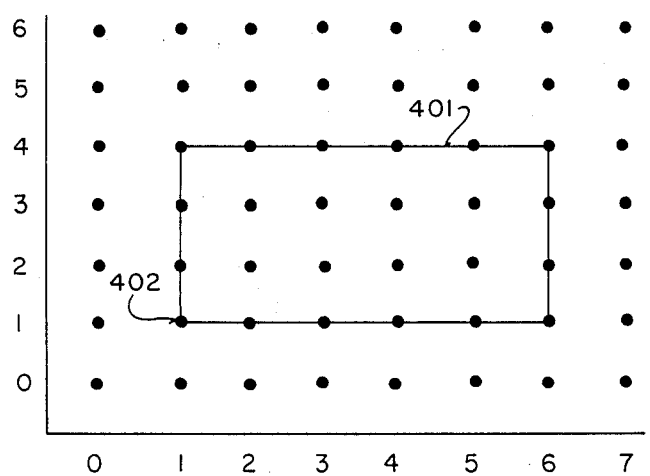
FIG_4B
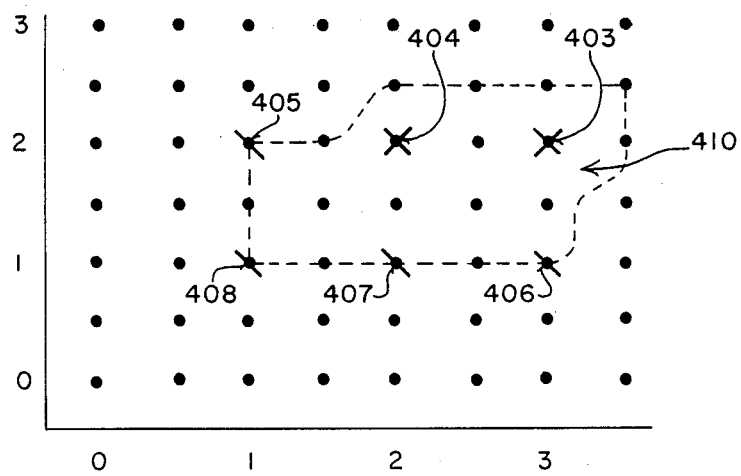

FIG_5
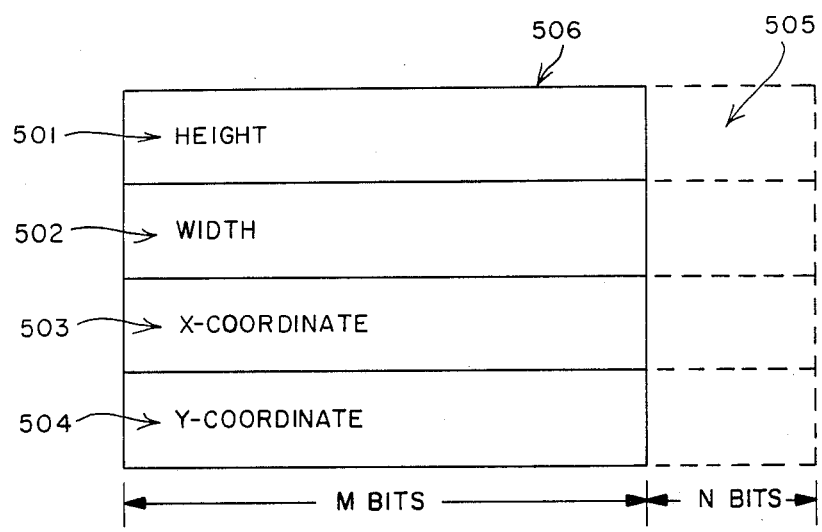
- 501 → HEIGHT
- 502 → WIDTH
- 503 → X-COORDINATE
- 504 → Y-COORDINATE
506, 505, M BITS, N BITS
FIG_6
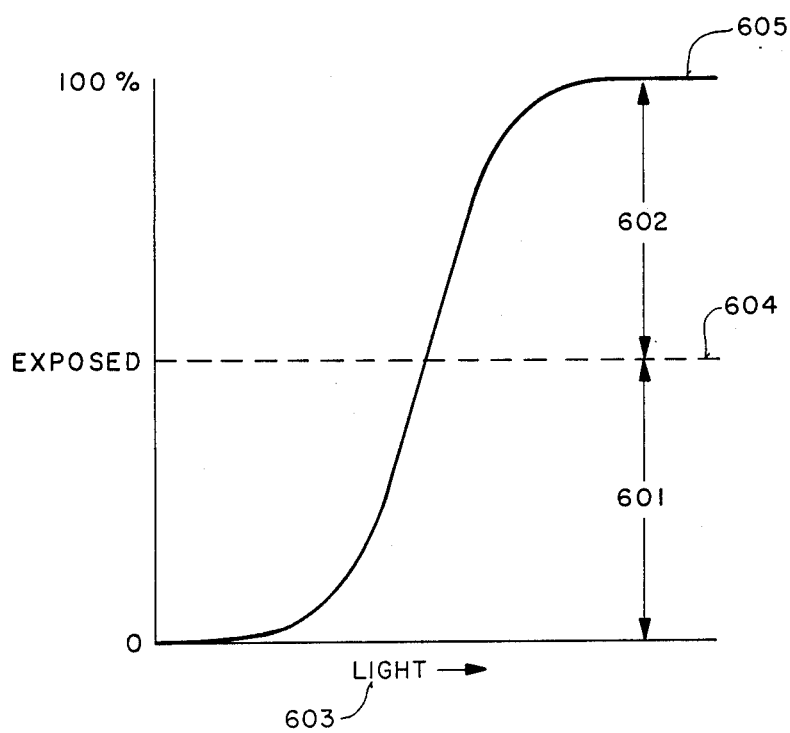

FIG_7A (PRIOR ART)
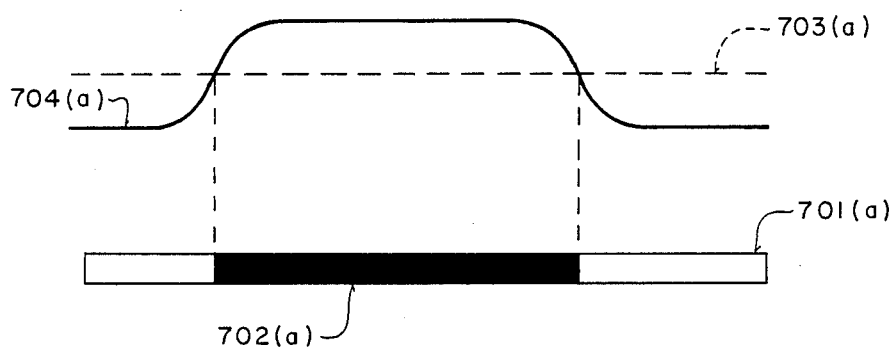
FIG_7B
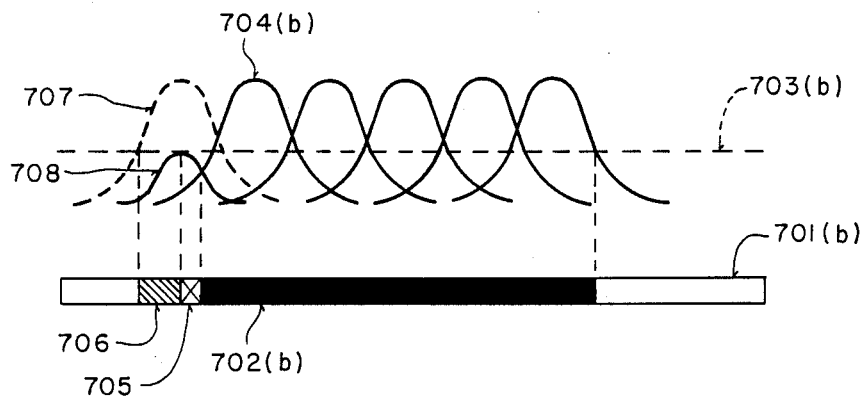
FIG_7C
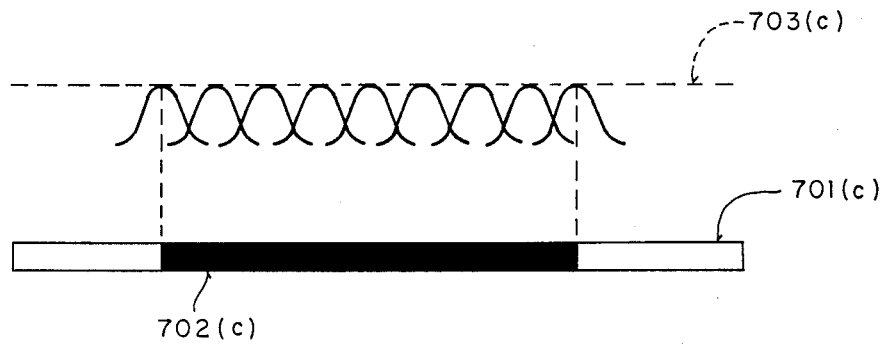

FIG_8
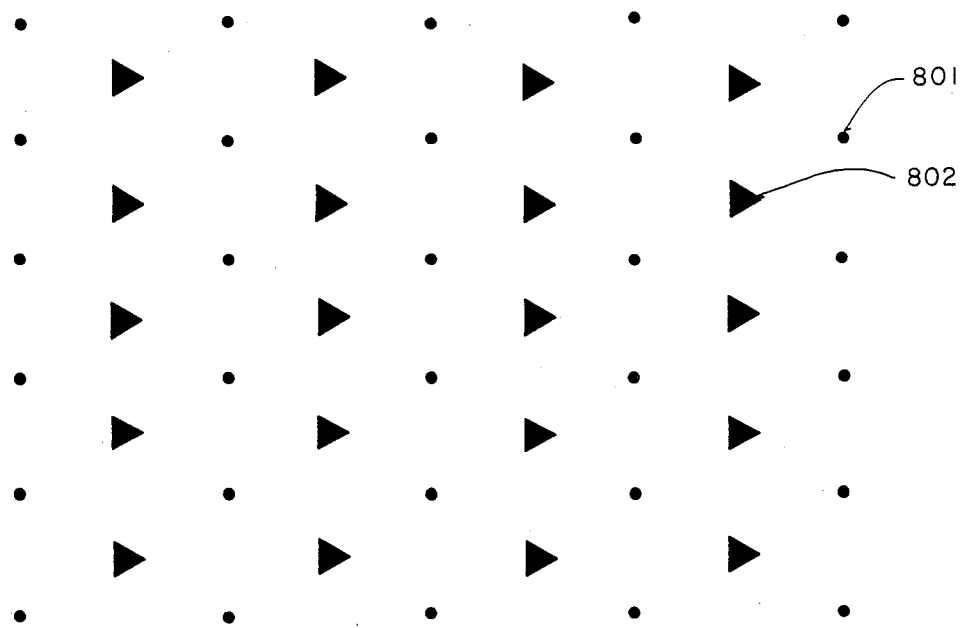
FIG_10
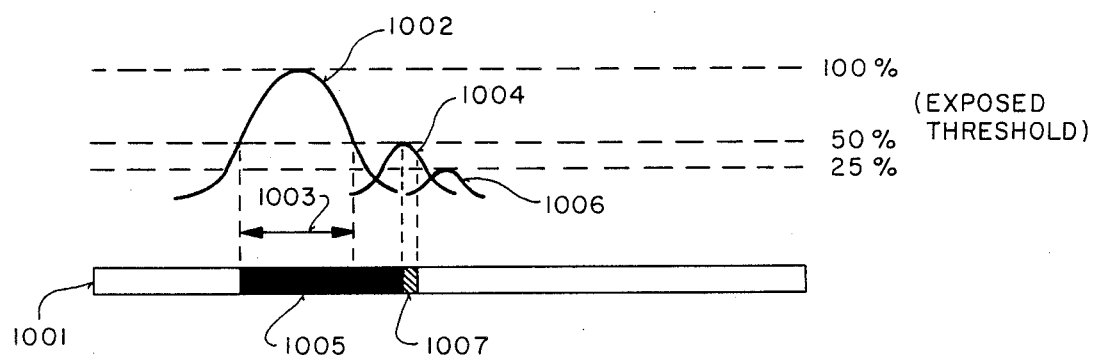

50% OF EXPOSED THRESHOLD

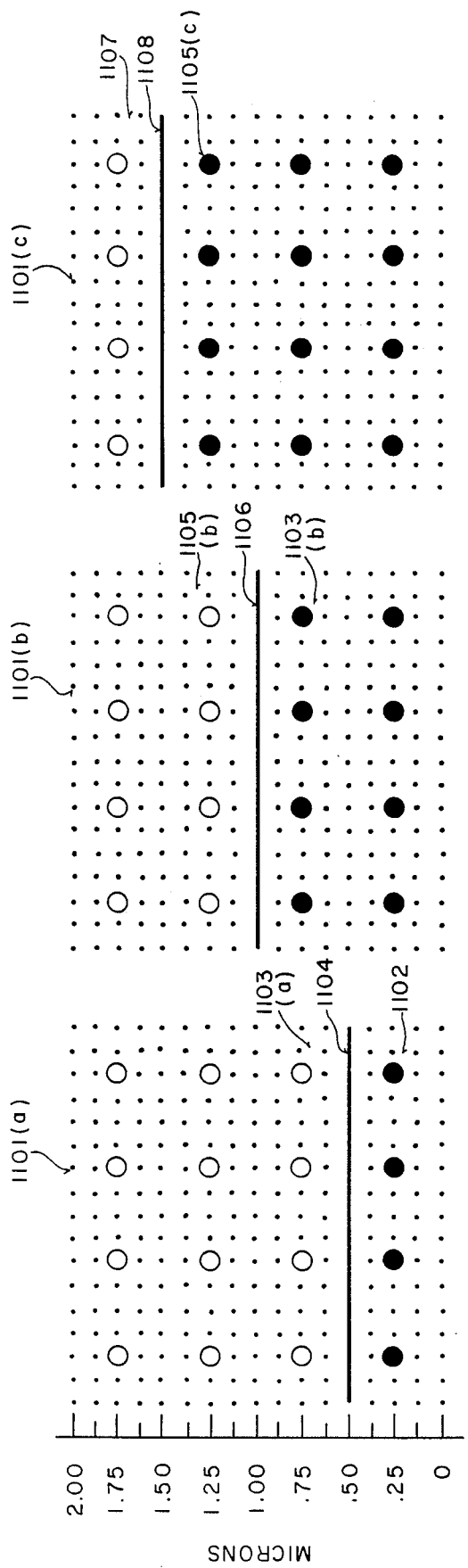

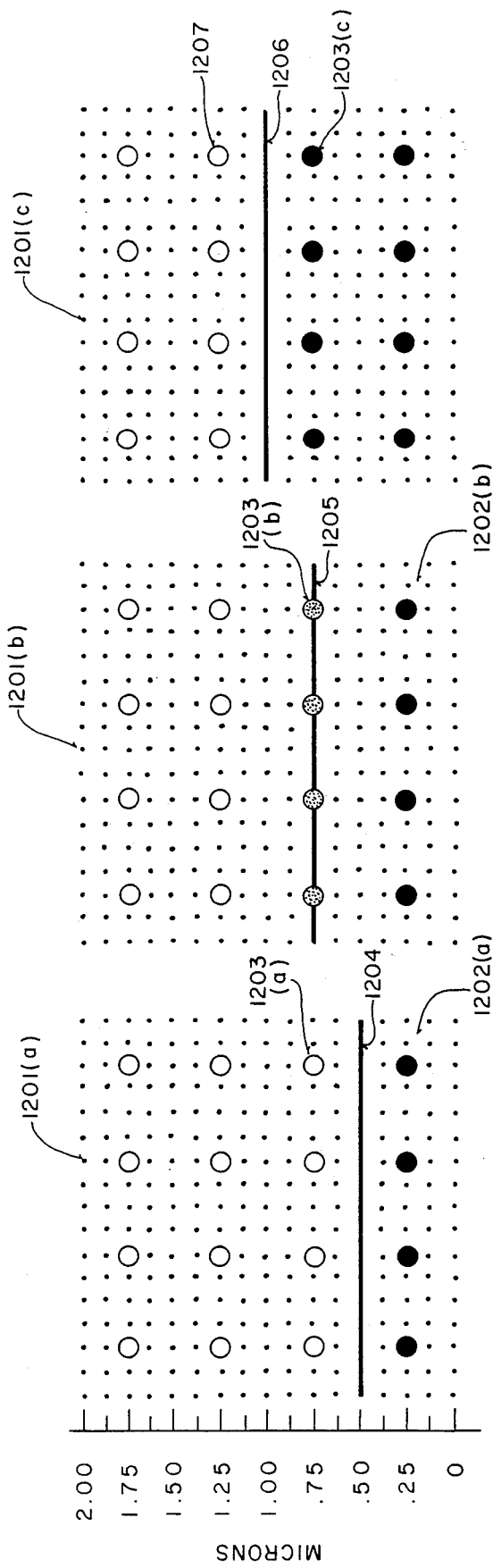

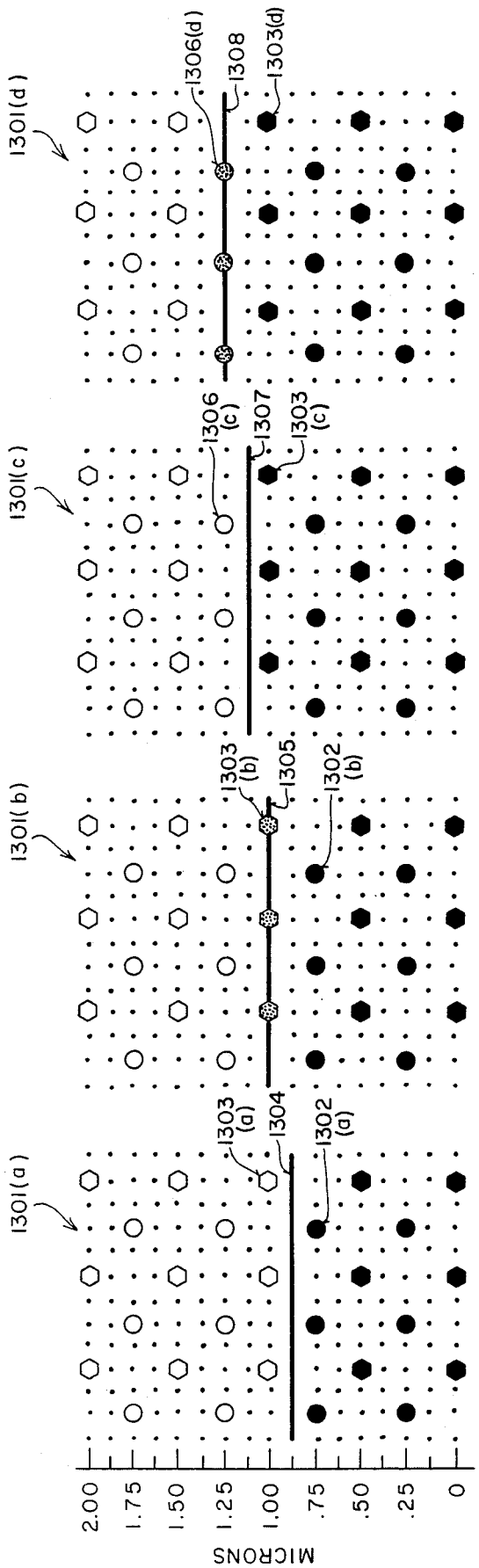

RASTERIZATION SYSTEM UTILIZING AN OVERLAY OF BIT-MAPPED LOW ADDRESS RESOLUTION DATABASES

BACKGROUND OF THE INVENTION

1. Field of the Invention

The present invention relates to a method and apparatus for high address resolution rasterization and, more specifically, to a method and apparatus for high address resolution rasterization using low address resolution rasterization and printing systems.

2. Prior Art

It is known to increase the address resolution of rasterized displays through one of a number of techniques. One method of improving address resolution is to increase "pixel" density and decrease the diameter of each individual pixel. Such a method yields improved address resolution, however, the ability to decrease the diameter of pixels and to increase the density is limited in most applications.

In a second method for improving address resolution, it is known to allow pixels to increase in density and be offset from each other with some degree of overlap between adjacent pixels. For example, referring to FIG. 1(a), two columns of pixels 101 and 102 are shown. In this example, each of the pixels of column 102 are offset slightly from the pixels of column 101. A specific application of this technique is shown with reference to FIG. 1(b). The letter "A" 103 is shown represented as a plurality of overlapping and offset pixels. This method is utilized by a number of dot matrix printer companies to produce what is often referred to as "near-letter-quality" print.

Other pertinent art includes a method, utilized by the Spectrum C2500 Series Plotter manufactured by Versatec of Santa Clara, Calif., in which low address resolution plot data is accepted and utilizes for plotting at a plotter's normal plotting address resolution. Referring to FIG. 1(c), when data is outputted by the plotter, each input bit to the plotter (represented by a darkened pixel in FIG. 1(c)), such as bit 105, is translated into a 2×2 pixel area, such as area 104. In FIG. 1(c), bits added by the translation are not blackened. A smoothing algorithm is define to minimize two-pixel steps on nonorthogonal lines. The bits added by this smoothing algorithm, such as bit 106, are indicated in FIG. 1(c) with hash marks.

It is further known to utilize a rasterization system in the fabrication of photolithographically formed patterns for production of integrated circuits. Such a system is disclosed in copending application entitled "RASTERIZER FOR PATTERN GENERATOR", Ser. No. 784,856, filed Oct. 4, 1985 and assigned to the assignee of the present application.

It is desired to develop an improved technique for providing high address resolution output from a low address resolution system and, more specifically, to develop such a system for use with a rasterizer used in the generation of photolithographically formed patterns.

SUMMARY OF THE PRESENT INVENTION

A method for providing improved address resolution output in a system used in production of photolithographically formed patterns. The method has particular application in the production of photolithographically produced masks and the like for production of integrated circuits.

The present invention discloses a method for printing high address resolution printed patterns from a high address resolution database utilizing a low address resolution printing system. The present invention discloses creating a plurality of low address resolution databases based on the high address resolution database and utilizing the plurality of low address resolution databases as input to a low address resolution printing system. The low address resolution printing system prints each of the low address resolution databases overlayed on each other, yielding a high address resolution printed pattern.

The preferred embodiment discloses use of a plurality of logical passes of a laser optical system to expose photosensitive material. A first set of passes exposes a first set of areas. Each of the passes in the first set may vary in dosage, thus exposing varying amounts of the photosensitive material. A second set of passes is made to expose a second set of areas, the second set of areas offset from the first. Each of the passes in the second set of passes may also vary in dosage of light.

BRIEF DESCRIPTION OF THE DRAWINGS

FIG. 1(a) is a diagram illustrating a known method of increasing address resolution of pixels by offsetting columns of pixels.

FIG. 1(b) further illustrates the known method of offsetting pixels to produce improved address resolution characters.

FIG. 1(c) illustrates a known method of displaying improved address resolution data from low address resolution input.

FIG. 2 is a block diagram showing a known rasterizer as may be utilized by the present invention.

FIG. 3 is a data flow diagram illustrating a method of the present invention.

FIGS. 4(a) and 4(b) are illustrative of formation of a geometric object by the present invention.

FIG. 5 is illustrative of the input data to a rasterizer of the present invention.

FIG. 6 is a graph illustrating a characteristic of photoresistive material.

FIGS. 7(a) through 7(c) are diagrams illustrating the effect of exposure of photoresist to a radiant energy source.

FIG. 8 is a pixel map illustrating pixel formation of the present invention.

FIG. 10 is a diagram further illustrative of the effect of exposure of photoresist to a radiant energy source.

FIGS. 11(a) through 11(c), 12(a) through 12(c) and 13(a) through 13(d) are diagrams illustrative of antialiasing and interstitial grid printing methods of the present invention.

DETAILED DESCRIPTION OF THE PRESENT INVENTION

Figure 9A:
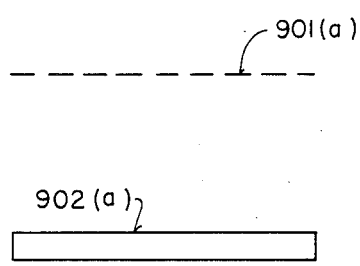
FIGS. 9(a) through 9(i) are diagrams further illustrative of the effect of exposure photoresist to a radiant energy source.

A method and apparatus for providing improved resolution output in a system used in production of photolithographically formed patterns is disclosed. In the following description, numerous specific details are set forth such as specific dimensions, etc. in order to provide a thorough understanding of the present invention. It will be obvious, however, to one skilled in the art that the present invention may be practiced without these specific details. In other instances, well-known structures and circuits have not been set forth in detail in order not to unnecessarily obscure the present invention.

The present invention discloses a method of generating high address resolution printed patterns from a high address resolution database in a printing system utilizing a low address resolution printer. The preferred embodiment may be utilized to generate photolithographically formed patterns for the production of integrated circuits and the like. Further, the preferred embodiment is described with reference to a laser optical system. It will be obvious to one of ordinary skill in the art that the methods of the present invention are equally applicable to other systems utilizing radiant energy to expose a substrate, an example being an electron beam system.

In the prior art, it is known to utilize the low address resolution printer of the present invention to produce photolithographically formed patterns. Such a system is exemplified by FIG. 2 and is further disclosed by Applicant's copending application Ser. No. 784,856, entitled "Rasterizer For Pattern Generator", filed Oct. 4, 1985, which is incorporated here by reference. Referring to FIG. 2, a pattern delivery computer 201 receives conventional data 200 defining patterns and converts the data to the format utilized by the rasterizer 202. Typically, in the fabrication of a semiconductor device each level of the device is "digitized" to delineate objects on that level. This data may set out the location, size and orientation of a trapezoid or other geometric object. The pattern delivery computer 201 converts the data into two geometric objects, rectangles and triangles. The rasterizer 202 operates on this converted data forming pixel data which drives the optical system 203.

It is an object of the present invention to utilize the pattern delivery computer 201, rasterizer 202 and optical system 203 to produce higher address resolution printed patterns.

Referring now to FIG. 3, a data flow diagram illustrating a method of the present invention is illustrated. A high address resolution database 301 defining patterns is utilized as input to a geometry dissolution process 302. The geometry dissolution process 302 may be executed on the pattern delivery computer 201 or other processor. The geometry dissolution process 302 may utilize any of a plurality of methods to create a plurality of low address resolution databases 303. As examples of methods which may be employed by the geometry dissolution process, a table look-up routine, in-line decision trees or other algorithm may be employed.

For example, utilizing rectangles as an example of a geometric object, the following algorithm may be utilized. Assume a rectangle may be described with reference to its origin (X,Y), height (H) and width (W). A plurality N of low address resolution databases 303 may be output by the geometry dissolution process 302 utilizing the algorithm:

For each geometry (i.e. rectangle)
Load geometry $(X_0, Y_0, H_0, W_0)$
For each pass 1 to N
$X_{pass} = (X_0 + X\_Offset_{pass}) >> log_2 N$
$Y_{pass} = (Y_0 + Y\_Offset_{pass}) >> log_2 N$
$H_{pass} = ((Y_0 + H_0 + H\_Offset_{pass}) >> log_2 N) - Y_{pass}$
$W_{pass} = ((X_0 + W_0 + W\_Offset_{pass}) >> log_2 N) - X_{pass}$
Store $(X_{pass}, Y_{pass}, H_{pass}, W_{pass})$
End pass
End Geometry The particular $X\_Offset_{pass}$, $Y\_Offset_{pass}$, $W\_Offset_{pass}$ and $H\_Offset_{pass}$ are determined based on the value of N and the particular geometry (i.e. rectangle, triangle, etc). The value of $X_{pass}$, $Y_{pass}$, $H_{pass}$ and $W_{pass}$ are right shifted log2N unit positions. As an example, referring to FIG. 4(a), a desired rectangle 401 is shown. The desired rectangle 401 has an origin 402 (X,Y) at (1,1) with a height of (H) of three units and a width (W) of five units. Assume a system in which two low address resolution geometries are generated (i.e. N=2). In such a system, $X\_Offset_1$, $Y\_Offset_1$, $H\_Offset_1$, and $W\_Offset_1$ are equal to 1. For pass 2, $X\_Offset_2$, $Y\_Offset_2$, $H\_Offset_2$, $W\_Offset_2$ are equal to 0. Then:

$X_1 = 1$ $Y_1 = 1$ $H_1 = 1$ $W_1 = 2$ and $X_2 = 0$ $Y_2 = 0$ $H_2 = 2$ $W_2 = 3$ FIG. 4(b) is illustrative of pixel grid which may be printed by a low address resolution printing system. Utilizing the geometries generated by the above algorithm, pixels 403 and 404 are selected by the first pass and pixels 403, 404, 405, 406, 407 and 408 are selected by the second pass. This yields a geometry 410 which corresponds closely with desired rectangle 401.

The low address resolution databases 303 are used as input to a rasterization process 304. The rasterization process 304 may process the plurality of low address resolution databases 303 either in parallel or serially. The rasterization process 304 is described in more detail with reference to Applicant's above-mentioned copending application.

The rasterization process 304 produces as output a plurality of bit mapped low address resolution databases 305 corresponding to the low address resolution databases 303. The format of these databases 305 as utilized by the preferred embodiment is described in more detail by Applicant's above-mentioned copending application and with reference to FIG. 5.

FIG. 5 illustrates the general format for the height 501, width 502, x-coordinate 503 and y-coordinate 504 data. The particular format of bits 506 are described in the Applicant's above-mentioned copending application. Bits 505 are provided in addition to bits 506 to provide additional addressing capability utilized by the present invention.

In general, a rectangle or right 45° triangle may be described with reference to its height 501, width 502, origin (comprised of an X axis coordinate 503 and Y axis coordinate 504) and its orientation (northwest of origin, southwest of origin, southeast of origin or northeast origin). The present invention utilizes a plurality N of additional bits 505 to define the plurality of geometries corresponding to the bit mapped low address resolution databases 305.

The bit mapped low address resolution databases 305 are utilized as inputs to an overlay printing process 306 in which a substrate 307 is printed with a desired pattern. In the preferred embodiment, the substrate 307 may comprise a photoresistive mask for production of integrated circuits or the patterns may be written directly onto a semiconductor wafer. The patterns may be written to the substrate 307 in a single pass or may be written in a plurality of separate passes corresponding to each of the bit mapped low address resolution databases. The term "logical pass" as used herein shall refer to the writing of one of the bit-mapped low address resolution databases whether in a separate physical pass or combined in a single pass.

The present invention combines techniques of interstitial grid or offset printing with an anti-aliasing or "line smoothing" technique in which a plurality of geometries are printed overlayed with each other, based on the plurality of bit mapped low address resolution databases 305.

Referring briefly to FIG. 6, a characteristic of photoresist is detailed. Typically, photoresist is unexposed (area 601) until after the application of a certain amount of light (or other radiant energy) 603. The photoresist then reaches an exposed threshold 604 and remains exposed during the application of more light (area 602). The exposure of photoresistive material to light may be in a single exposure or may be cumulative over some plurality of exposures.

Referring now to FIG. 7(a), a substrate 701(a) is shown comprising a photoresistive material. The substrate 701(a) is exposed to a light source over its surface such as that shown by graph line 704(a). When the light source reaches the exposed threshold of the photoresistive material shown by line 703(a), the surface of the substrate is exposed upon development (area 702(a)).

As shown by FIG. 7(b), substrate 701(b) may be exposed with a plurality of pixel exposures, such as shown graphically by line 704(b). Due to the properties discussed above of photoresistive material, substrate 701(b) is properly exposed in area 702(b). Assume it is desired to expose area 705. Exposure of another pixel 707 would result in both areas 705 and 706 being exposed, yielding an exposed area larger than desired. By reducing the dosage of the light source as shown by graph 708, only desired area 705 is exposed to the exposure threshold level 703(b).

As illustrated by FIG. 7(c), the present invention discloses exposing an area 702(c) of substrate 701(c) through use of a plurality of logical passes of the beams from the optical system 203 of FIG. 2. In a printing system utilizing a low address resolution printer, the logical passes may be offset from each other. For example, in the preferred embodiment, an interstitial grid is utilized in which a first set of logical passes exposes a first set of pixel locations and a second set of logical passes exposes a second set of pixel locations. The second set of pixel locations is offset and centered between the first set of pixels. For example, with reference to FIG. 8, a first plurality of pixels are represented by dots such as dot 801 and a second plurality of pixels, offset and centered from the first plurality of pixels, are represented by triangles, such as triangle 802.

In the preferred embodiment, each logical pass of the laser optical system provides a light dosage approximately equal to one-half the exposure threshold level 703(c). The preferred embodiment makes two logical passes at each pixel location on each grid totalling four passes. During each pass the light source may either be on or off. Each pass provides approximately one-fourth of the 100% exposure dosage 605 of FIG. 6.

Thus, for any combination of two pixel locations there are a number of possible patterns which may be printed. As illustrated by FIGS. 9(a) through 9(i) and the below table, in a system utilizing four logical passes of the light source (two logical passes per pixel) and each pass yielding approximately the exposure threshold dosage of light at its peak value, nine distinct patterns may result.

The four logical passes in fact yield sixteen different combinations. For example, referring to pattern 2 in the table below, whether the light source is on in pass 3 or pass 4 will yield the same approximate pattern and only pass 3 having the light source on is illustrated in detail. In the preferred embodiment, the seven combinations not illustrated in FIGS. 9(a) through 9(i) are actually utilized in certain instances depending on the adjacent geometries and other factors.

In the illustrated example, pixel 1 is exposed by pass and pass 2 and pixel 2 is exposed by pass 3 and pass 4. Again, it will be obvious that passes 1, 2, 3 and 4 may occur either serially or in parallel.

In the figures, FIG. 9(a) corresponds to pattern number 1, 9(b) to pattern number 2, 9(c) to pattern number 3, etc.

| PATTERN# | PIXEL | PASS 1 | PASS 2 | PASS 3 | PASS |
|---|---|---|---|---|---|
| 1 | 1 | OFF | OFF | | |
| | 2 | | | OFF | OF |
| 2 | 1 | OFF | OFF | | |
| | 2 | | | ON | OF |
| 3 | 1 | OFF | OFF | | |
| | 2 | | | ON | ON |
| 4 | 1 | ON | OFF | | |
| | 2 | | | OFF | OF |
| 5 | 1 | ON | OFF | | |
| | 2 | | | ON | OF |
| 6 | 1 | ON | OFF | | |
| | 2 | | | ON | ON |
| 7 | 1 | ON | ON | | |
| | 2 | | | OFF | OF |
| 8 | 1 | ON | ON | | |
| | 2 | | | ON | OF |
| 9 | 1 | ON | ON | | |
| | 2 | | | ON | ON |

10 Referring to FIGS. 9(a)–9(i), lines 901(a)–901(i) correspond to an exposure threshold level dosage of light for exposing substrates 902(a)–902(i). It will be obvious to one of ordinary skill in the art that the Gaussian distributions represented by graphs 904(b) through 904(i) and the particular number of pixels may vary. The cumulative radiant energy dosage on any particular area of the substrate is determinitive of exposure.

In FIG. 9(a), both pixel 1 and pixel 2 are unexposed in each pass of the light source. The result is a pattern not being printed in the substrate.

Figure 9B:
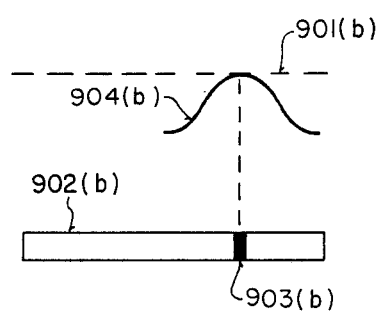

In FIG. 9(b), graph 904(b) illustrates pixel 2 being exposed during one pass of the light source. The result is exposure of area 903(b) on the substrate 902(b). Although the particular example shows exposed area 903(b) as being essentially a dot on the substrate 902(b), in fact when combined with exposure by adjacent pixels not shown, further patterns are developed.

Figure 9C:
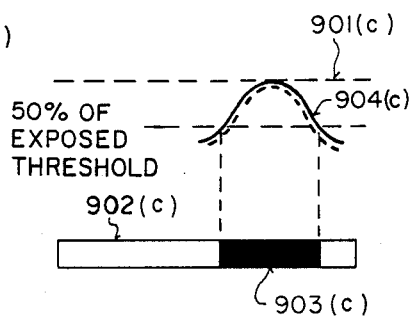

In FIG. 9(c), graph 904(c) illustrates pixel 2 being exposed during both pass 3 and 4 of the light source. Pixel 1 remains unexposed yielding an exposed area 903(c) on the substrate 902(c). The combined dosage of light from the first and second pass causes the cumulative effect of the light on the photoresistive substrate 902(c) to yield the exposed area 903(c). The exposed area 903(c) corresponds approximately to the area which is under the graph 904(c) at 50% of the exposure threshold.

Figure 9D:
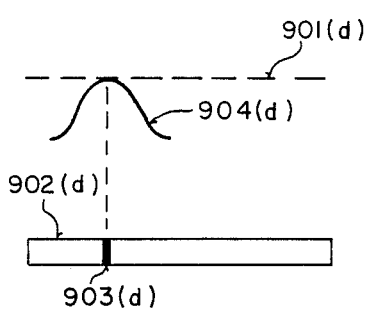

Referring to FIG. 9(d), pixel 1 is exposed during one pass of the light source as shown graphically by graph 904(d). This results in area 903(d) being exposed on substrate 902(d). In FIG. 9(d), pixel 2 remains unexposed.

Figure 9E:
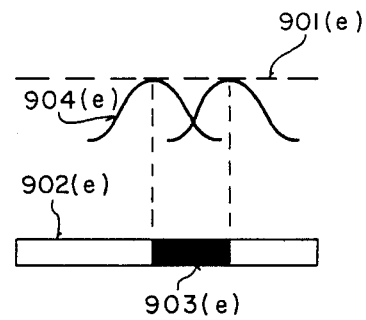

Referring to FIG. 9(e), as shown by graph 904(e) pixel 1 is exposed during one pass of the light source and pixel 2 is exposed during one pass of the light source. The cumulative effect of exposures of pixel 1 and pixel 2 yields exposed area 903(e) on substrate 902(e).

Figure 9F:
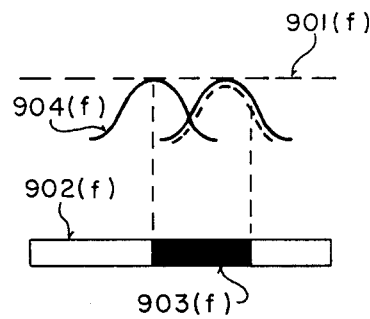

Referring to FIG. 9(f), graph 904(f) illustrates pixel 1 being exposed during one pass of the light source and pixel 2 being exposed during two passes of the light source. This yields exposed area 903(f) on substrate 902(f).

Figure 9G:
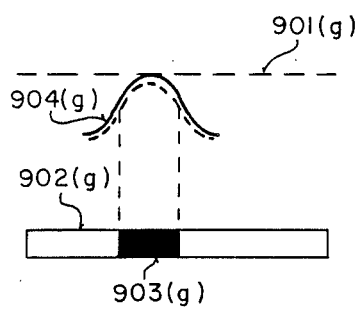

Referring to FIG. 9(g), graph 904(g) illustrates exposure of pixel 1 during two passes of the light source yielding exposed area 903(g) on substrate 902(g). In FIG. 9(g), pixel 2 remains unexposed. FIG. 9(g) is essentially a mirror image of FIG. 9(c).

Figure 9H:
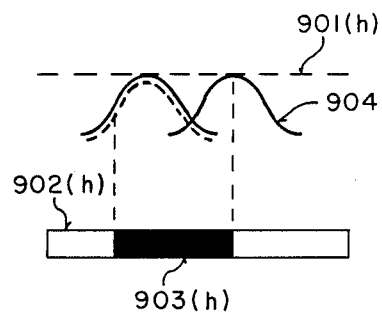

Referring FIG. 9(h), graph 904(h) illustrates pixel 1 being exposed during two passes of the light source and pixel 2 being exposed during one pass of the light source yielding exposed area 903(h) on substrate 902(h). FIG. 9(h) is essentially a mirror image of FIG. 9(f).

Figure 9I:
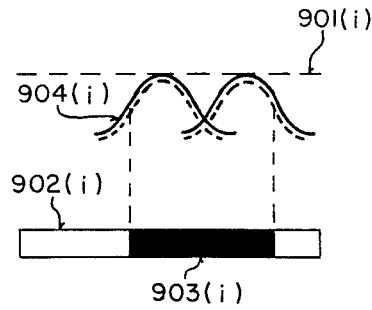

Finally, FIG. 9(i) illustrates graph 904(i) in which pixel 1 is exposed during two passes of the light source and pixel 2 is exposed during two passes of the light source. The result is exposure of the area 903(i) on substrate 902(i).

Utilizing the various combinations of exposure of pixels as illustrated by FIG. 9(a)-9(i), it will be obvious that geometric objects may be drawn with boundary edges at the center of a pixel or at the outer edge of a pixel area. It will be further obvious to one of ordinary skill in the art that the above two pixel example is extendable to a system in which any number of pixels are utilized and the accumulative light dosage from adjacent pixels may yield a number of distinct patterns.

It is further obvious that the above example is extendable to a system in which the dosage of light is varied from pass to pass. For example, with reference to FIG. 10, a first pas may expose an area of a substrate 1001 as illustrated by graph 1002 to a relative dosage of 100% exposing area 1003. A second pass may expose an area of the substrate 1001 at a relative dosage of 50%, exposing area 1005 due to the cumulative dosage effect of graph 1002 and graph 1004. A third pass may expose area 1007 due to the cumulative effect of graph 1004 and graph 1006 which has a relative dosage of 25%. The result is a yield of increasingly better address resolution through use of multiple logical pass exposures at varying intensities of overlayed geometries.

The method of utilizing interstitial grids and antialiasing techniques to produce better boundary resolutions is further illustrated with reference to FIGS. 11(a)-11(c), 12(a)-12(c) and 13(a)-13(d).

Referring to FIGS. 11(a)-11(c), a conventional method of writing to grids 1101(a), 1101(b), and 1101(c) is illustrated. In FIGS. 11(a)-11(c), pixels are offset on approximately 0.5 micron centers. In FIG. 11(a), pixel row 1102 is fully exposed by a light source of a relative dosage of 100%. Pixel row 1103(a) remains unexposed. This yields an effective feature edge 1104 midway between pixel row 1102 and pixel row 1103(a). Referring to FIG. 11(b), by exposing pixel row 1103(b) and leaving pixel row 1105(b) unexposed the effective feature edge is moved approximately 0.5 microns. Referring to FIG. 11(c) by exposing row 1105(c) and leaving row 1107 unexposed the feature edge 1108 is moved again approximately 0.5 microns.

Referring to FIGS. 12(a)-12(c), the effect of utilizing an anti-aliasing technique is demonstrated. Again, grids 1201(a), 1201(b) and 1201(c) have pixels located on approximately 0.5 micron centers.

In FIG. 12(a) pixel 1202(a) is fully exposed to a light source with a relative dosage of 100%. Pixel row 1203(a) remains unexposed yielding an effective feature edge 1204 approximately midway between rows 1202(a) and 1203(a). This corresponds with the edge of FIG. 11(a). In FIG. 12(b), pixel row 1202(b) is exposed to a light source of a relative dosage of 100% and row 1203(b) is exposed to a light source of a relative dosage of approximately 50%. As shown in connection with FIG. 10, this yields an effective feature edge approximately on the center of pixel row 1203(b), line 1205. In FIG. 12(c) row 1203(c) is exposed to a relative light source dosage of 100% and row 1207 remains unexposed, yielding an effective feature edge 1206 approximately midway between rows 1203(c) and 1207. Thus, use of the anti-aliasing technique yields an effective 0.25 micron writing grid using pixels on 0.50 micron centers. It will be obvious to one of ordinary skill in the art that other pixel densities will yield corresponding effective writing grids.

Referring to FIGS. 13(a)-13(d), the combined use of an anti-aliasing technique and interstitial grids is shown to yield yet more improved address resolution. Grids 1301(a)-1301(d) have a first set of pixels, represented by circles, on approximately 0.5 micron centers and a second set of pixels, represented by hexagons, on approximately 0.5 micron centers. The second set of pixels are offset and centered between the first set of pixels.

In FIG. 13(a), pixel row 1302(a) is exposed to a light source of relative dosage of 100% and pixel row 1303(a) remains unexposed. This yields an effective feature edge 1304 approximately midway in between pixel row 1302(a) and pixel row 1303(a) and corresponds approximately with FIG. 9(g). FIG. 13(b) illustrates pixel row 1302(b) being exposed to a light source relative dosage of 100% and pixel row 1303(b) being exposed to a light source of relative dosage of 50% yielding effective feature edge 1305. This corresponds approximately with FIG. 9(h). FIG. 13(c) illustrates pixel row 1303(c) being exposed to light source of relative dosage of 100% and pixel row 1306(c) remaining unexposed yielding effective feature edge 1307 and corresponding approximately with FIG. 9(c). FIG. 13(d) illustrates pixel row 1303(d) being exposed to a light source of relative dosage of 100% and pixel row 1306(d) being exposed to a light source relative dosage of 50% yielding effective feature edge 1308 and corresponding approximately with FIG. 9(f). The combination of the anti-aliasing technique and interstitial grids yields a 0.125 micron effective writing grid in a system having a first set of pixels offset on approximately 0.5 micron centers and a second set of pixels, offset and centered from the first set of pixels, on approximately 0.5 micron centers. This allows a low address resolution printing system which is able to write to pixel locations on approximately 0.5 micron centers to yield an effective 0.125 micron writing grid utilizing multiple logical passes of the light source.

Thus, a method and apparatus for producing high address resolution printed patterns from a high address resolution database utilizing a low address resolution printing system is described.

We claim:

1. A method for producing a high address resolution printed pattern from a high address resolution database, comprising the steps of:

producing a plurality of low address resolution databases based on said high address resolution database, said plurality of low address resolution database comprising a plurality of overlay patterns corresponding to said high address resolution printed pattern;

producing a plurality of low address resolution patterns from said low address resolution databases; and printing each of said low address resolution patterns overlayed on each other, said printing step comprising the steps of printing a first set of low address resolution patterns utilizing a first plurality of pixels; and printing a second set of said low address resolution patterns utilizing a second plurality of pixels, said second plurality of pixels offset and centered from said first plurality of pixels.

2. The method as recited by claim 1, wherein said printing process comprises the steps of:

printing a first of said plurality of low address resolution printed patterns on a substrate utilizing an energy source, said energy source producing radiant energy at a first dosage;

printing a second of said plurality of low address resolution printed patterns on a substrate utilizing an energy source, said energy source producing radiant energy at a second dosage.

3. The method as recited by claim 2, wherein said first dosage and said second dosage are approximately equal to an exposure threshold level of said substrate.

4. The method as recited by claim 1, wherein said plurality of low address resolution databases comprises four databases.

5. The method as recited by claim 1, wherein said plurality of low address resolution databases are generated based on a table look-up algorithm.

6. The method as recited by claim 1, wherein said high address resolution database comprises a first X-coordinate of said pattern, a first Y-coordinate of said pattern, a first height dimension of said pattern and a first width dimension of said pattern, and said plurality of low address resolution databases are generated by a method comprising the steps of:

for each of said plurality of low address resolution databases;

(a) accepting as input said first X-coordinate, said first Y-coordinate, said first height dimension and said first width dimension;

(b) computing a second X-coordinate based on said first X-coordinate and a first predetermined value;

(c) computing a second Y-coordinate based on said first Y-coordinate and a second predetermined value;

(d) computing a second height dimension based on said first height dimension, said first Y-coordinate and a third predetermined value;

(e) computing a second width dimension based on said first width dimension, said first X-coordinate and a fourth predetermined value.

7. In a system for producing a rasterized pattern from data representing geometric objects, said system comprising a high address resolution database representing a geometry to be printed and a low address resolution printing system, a method comprising the steps of:

producing a plurality of low address resolution databases having a format compatible with said low address resolution printing system, said plurality of said low address resolution databases representing a plurality of overlay patterns corresponding to said geometry; and producing a plurality of bit mapped low address resolution databases for input to a radiant energy system said radiant energy system accepting said plurality bit mapped low address resolution databases and producing a plurality of overlay patterns on a substrate in response to said bit mapped low address resolution database said step of producing a plurality of overlay patterns on a substrate comprising the steps of:

printing a first of said overlay patterns utilizing a first plurality of pixels; and printing a second of said overlay patterns utilizing a second plurality of pixels, said second plurality of pixels offset and centered from said first plurality of pixels.

8. The method as recited by claim 7, wherein said process of producing a plurality of overlay patterns on a substrate comprises the steps of:

printing a first of said overlay patterns on said substrate utilizing a energy source, said energy source producing radiant energy at a first dosage;

printing a second of said overlay patterns of said substrate utilizing a energy source, said energy source producing radiant energy at a second dosage.

9. The method as recited by claim 8, wherein said first dosage and said second dosage are approximately equal to an exposure threshold level of said substrate.

10. The method as recited by claim 7, wherein said plurality of low address resolution databases comprises four databases.

11. The method as recited by claim 8, wherein said radiant energy source is a light source.

12. The method as recited by claim 9, wherein said radiant energy source is an electron beam means.

13. In an apparatus for generating a rasterized pattern representing a geometric object, said apparatus comprising a high address resolution database and a low address resolution printing system, a method of generating said rasterized pattern comprising the steps of:

exposing a substrate to a light source at a first set of pixel locations during a first logical pass of said light source, said light source producing radiant energy at a first dosage;

exposing said substrate to a light source at said first set of pixel locations during a second logical pass of said light source producing radiant energy at a second dosage.

14. The method as recited by claim 13, further comprising the steps of:
exposing said substrate to a light source at a second set of pixel locations, said second set of pixel locations offset and centered from said first set of pixel locations during a third logical pass of a light source, said light source producing radiant energy at a third dosage;
exposing said substrate to a light source at said second set of pixel locations during a fourth logical pass of said light source, said light source producing radiant energy at a fourth dosage.

15. The method as recited by claim 13, wherein said first dosage and said second dosage are each approximately equal to the exposure threshold value of said substrate.

16. The method as recited by claim 14, wherein said first dosage, said second dosage, said third dosage and said fourth dosage are each approximately equal to the one-half exposure threshold of said substrate.

17. A method for producing a high address resolution printed pattern from a high address resolution database, said high address resolution database comprising a first X-coordinate of said pattern, a first Y-coordinate of said pattern, a first height dimension of said pattern and a first width dimension of said pattern comprising the steps of:
(A) producing a plurality of low address resolution databases based on said high address resolution database, said plurality of low address resolution databases comprising a plurality of overlay patterns corresponding to said high address resolution printed pattern;
(B) producing a plurality of low address resolution patterns from said low address resolution databases said plurality of low address resolution databases generated by a method comprising the steps of:
for each of said plurality of low address resolution databases;
(1) accepting as input said first X-coordinate, said first Y-coordinate, said first height dimension and said fist width dimension;
(2) computing a second X-coordinate based on said first X-coordinate and a first predetermined value;
(3) computing a second Y-coordinate dimension based on said first Y-coordinate and a second predetermined value;
(4) computing a second height dimension based on said first height dimension, said first Y-coordinate and a third predetermined value;
(5) computing a second width dimension based on said first width dimension, said first X-coordinate and a fourth predetermined value;
(C) printing each of said low address resolution patterns overlayed on each other.

18. A method for producing a high address resolution printed pattern from a high address solution database, comprising the steps of:
producing a plurality of low address resolution databases based on said high address resolution database, said plurality of low address resolution databases comprising a plurality of overlay patterns corresponding to said high address resolution printed pattern;
producing a plurality of low address resolution patterns from said low address resolution databases;
printing each of said low address resolution pattern overlayed on each other, said printing process comprising the steps of:
(a) printing a first of said plurality of low address resolution printed patterns on a substrate utilizing an energy source, said energy source producing radiant energy at a first dosage;
(b) printing a second of said plurality of low address resolution printed patterns on a substrate utilizing an energy source, said energy source producing radiant energy at a second dosage.

19. The method as recited by claim 18, wherein said first dosage and said second dosage are approximately equal to an exposure threshold level of said substrate.

20. In a system for producing a rasterized pattern from data representing geometric objects, said system comprising a high address resolution database representing a geometry to be printed and a low address resolution printing system, a method comprising the steps of:
producing a plurality of low address resolution databases having a format compatible with said low address resolution printing system, said plurality of said low address resolution databases representing a plurality of overlay patterns corresponding to said geometry; and
producing a plurality of bit mapped low address resolution databases for input to a radiant system, said radiant energy system accepting said plurality of bit mapped low address resolution databases and producing a plurality of overlay patterns on a substrate in response to said bit mapped low address resolution databases, said process of producing a plurality of overlay patterns on a substrate comprising the steps of:
printing a first of said overlay patterns on said substrate utilizing an energy source, said energy producing radiant energy at first dosage;
printing a second of said overlay patterns of said substrate utilizing an energy source, said energy source producing radiant energy at a second dosage.

21. The method as recited by claim 20, wherein said first dosage and said second dosage are approximately equal to an exposure threshold level of said substrate.

22. The method as recited by claim 18 or 20, wherein said energy is provided by an electron beam means.

23. In a system for producing a rasterized pattern from data representing geometric objects, said system comprising a high address resolution database representing a geometry to be printed and a low address resolution printing system, a method comprising the steps of:
producing a plurality of low address resolution on databases having a format compatible with said low address resolution printing system, said plurality of said low address resolution databases representing a plurality of overlay patterns corresponding to said geometry; and
producing a plurality of overlay patterns on a substrate in response to said low address resolution printing system accepting said plurality of bit mapped low address resolution databases, said step of producing a plurality of overlay patterns on a substrate comprising the steps of:
printing a first of said overlay patterns utilizing a first
printing a second of said overlay patterns utilizing a second plurality of pixels, said second plurality of pixels offset and centered from said first plurality of pixels.

* * * * *

UNITED STATES PATENT AND TRADEMARK OFFICE
CERTIFICATE OF CORRECTION

PATENT NO.   : 4,879,605
DATED        : 11/7/89
INVENTOR(S)  : Warkentin et al.

It is certified that error in the above-identified patent and that said Letters Patent is hereby corrected as shown below:

| | | |
|---|---|---|
| col. 03, line 62 | delete ">" | insert -->>-- |
| col. 04, line 20 | before "X =1" | delete "35" |
| col. 04, line 25 | delete "w, =2" | insert --$W_I$ =2-- |
| col. 06, line 26 | after "pass" | insert --1-- |
| col. 07, line 55 | delete "pas" | insert --pass-- |
| col. 11, line 44 | delete "fist" | insert --first-- |
| col. 11, line 59 | delete "solution" | insert --resolution-- |
| col. 12, line 28 | after "radiant" | insert --energy-- |
| col. 12, line 37 | after "said energy" | insert --source-- |
| col. 12, line 51 | after "resolution" | delete "on" |
| col. 12, line 63 | after "utilizing a first" | insert --plurality of pixels; and-- |

Signed and Sealed this

Ninth Day of July, 1991

*Attest:*

HARRY F. MANBECK, JR.

*Attesting Officer*   Commissioner of Patents and Trademarks

UNITED STATES PATENT AND TRADEMARK OFFICE
CERTIFICATE OF CORRECTION

PATENT NO. : 4,879,605

DATED : 11/7/89

INVENTOR(S) : Warkentin et al.

It is certified that error in the above-identified patent and that said Letters Patent is hereby corrected as shown below:

| | | |
|---|---|---|
| col. 10, line 54 | delete "8" | insert --7-- |
| col. 10, line 56 | delete "9" | insert --7-- |

Signed and Sealed this

Eleventh Day of August, 1992

*Attest:*

DOUGLAS B. COMER

*Attesting Officer*     *Acting Commissioner of Patents and Trademarks*